June 7, 1966 R. J. GREEN 3,255,005

MASKING PROCESS FOR SEMICONDUCTOR ELEMENTS

Filed June 29, 1962

INVENTOR

RALPH J. GREEN

BY Eyre, Mann & Lucas

ATTORNEY

United States Patent Office 3,255,005

Patented June 7, 1966

3,255,005
MASKING PROCESS FOR SEMICONDUCTOR ELEMENTS

Ralph J. Green, Newark, N.J., assignor to Tung-Sol Electric Inc., a corporation of Delaware Filed June 29, 1962, Ser. No. 206,407
2 Claims. (Cl. 96—36)

This invention relates to a process for covering portions of a semiconductor crystal with a photo-resist material which remains on the crystal to act as an insulator to suppress leakage currents. The invention has particular reference to a process for covering the exposed parts of a silicon crystal which may be converted into a junction.

Silicon crystals in slab form are being used as the basis for rectifiers, transistors, and other circuit components. All of these units are formed with junction surfaces at the center of the crystal slab and the currents through the element should traverse only the central area of the crystal. It has been found that under certain circumstances there is considerable leakage around the edges of the junction, these leakage currents tending to short circuit the currents through the crystal and thereby detracting from the main junction of the circuit element. The present invention is a planar process which eliminates these leakage currents and insures that all the current passing between junctions traverses the body of the crystal. The method includes the deposition of a glass mask over the surface of the crystal where the junction terminates. The glass mask is formed in intimate contact with the silicon surface so that the current barrier removes all leakage currents.

One of the objects of this invention is to provide an improved masking process which avoids one or more of the disadvantages and limitations of prior art processes.

Another object of the invention is to eliminate side etching of the crystal during the formation of rectifiers and transistors.

Another object of the invention is to form a mask on a semiconductor component which can not peel off.

Another object of the invention is to eliminate undercutting during an etching process.

Another object of the invention is to produce a semiconductor circuit component having a minimum leakage at the edge portions of the junction.

The invention comprises the following masking process for preparing semiconductor elements. The silicon crystal is first oxidized by heating it in an atmosphere containing oxygen. This forms a thin layer of silicon oxide on one or both sides of the crystal. A layer of powdered photosensitive material is next applied to the oxide surface and the element is heated to melt the powdered material and form a unitary covering on the crystal. An opaque mask is now applied to the element to block off the edge areas and the unmasked areas are then exposed to actinic radiaiton such as ultraviolet light. The element is now heated to activate the exposed areas and then the entire crystal is treated with an etching solution such as hydrofluoric acid to dissolve the irradiated area and uncover the top surface of the silicon crystal.

For a better understanding of the present invention together with other and further objects thereof, reference is made to the following description taken in connection with the accompanying drawings.

Figure 1:
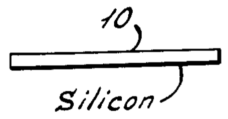
FIG. 1 is a side view of a silicon crystal suitable for circuit components such as rectifiers and transistors.
Figure 2:
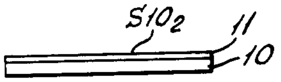
FIG. 2 illustrates the first step of the process and is a side view of the crystal with a layer of silicon oxide on one side.
Figure 3:
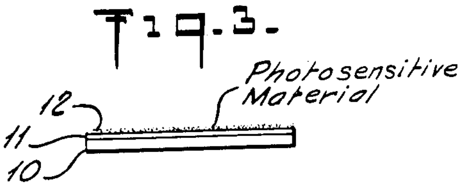
FIG. 3 illustrates the second step and shows the silicon crystal with a layer of powdered photosensitive material on top of the silicon oxide.
Figure 4:
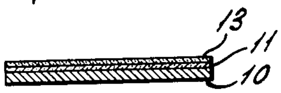
FIG. 4 illustrates the third step in the process and shows a sectional view of the crystal after the powdered material has been melted to form a unitary covering.
Figure 5:
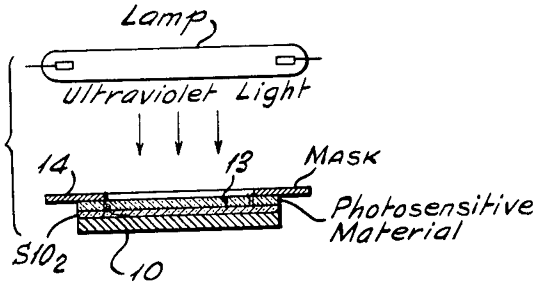
FIG. 5 illustrates the fourth step in the process and shows an opaque mask applied to the composite crystal and a lamp which irradiates the unmasked portions of one side of the crystal.

Referring now to the drawing, a slab of silicon 10 is employed to form the semiconductor element. This slab is cut from a single crystal, preferably cut along the III crystallographic plane. The crystal slab 10 is first put into an oven and heated in an oxidizing atmosphere until a layer 11 of silicon is formed on the surface. This layer may have a thickness which lies within the range of one-quarter to one-tenth of a micron.

A thin layer of photosensitive material 12 is now placed on the oxide layer. This material may be glass powder having a composition as described in Patent 2,515,940, issued to S. D. Stookey on January 18, 1950. Other patents and articles describe suitable photosensitive glass and the details of its composition and method of development. The crystal with the powdered glass is now put into a furnace and the temperature raised until the glass powder is melted and forms a single unitary covering 13 on one side of the crystal element.

An opaque mask 14 is now placed on the element and the photosensitive glass 13 is irradiated with ultraviolet light to expose the glass and activate it for subsequent development. It is to be understood that any type of actinic radiation may be used as long as the photosensitive material is properly activated. For the material described in the above mentioned patent, ultraviolet light having a wave length of about .4 micron or less produces good results and an exposure of about two minutes under a quartz mercury arc is sufficient. The opaque mask is now removed and the crystal is heated in a furnace to develop the exposed glass. This step in the process darkens the glass at the exposed areas, this darkening being due to the precipitation of several chemical substances in the glass. The crystal is now immersed in a dilute solution of hydrofluoric acid until both the developed glass layer and the layer of silicon oxide directly therebeneath are dissolved to expose the underlying surface of the silicon crystal.

Figure 7:
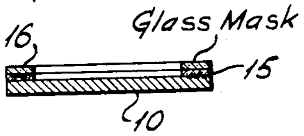
FIG. 7 is a cross sectional view of the finished semiconductor element, ready for the application of junctions and taken on the line 7—7 of FIG. 6.
Figures 6, 8:
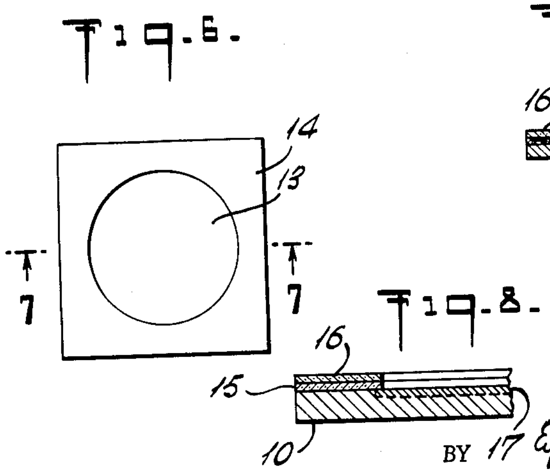
FIG. 6 is a plan view of the crystal shown in FIG. 5.
FIG. 8 is a partial cross sectional view similar to FIG. 7 but to an enlarged scale. This figure shows the relative positions of the insulation film and the edge of the junction.

The crystal now includes a border of silicon oxide 15 (FIG. 7) around its edges protected by a glass mask 16. The central portion of the crystal is bare and is suitable for the application of doping agents, diffusion processes, and junctions. The addition of these components and processes produce the desired circuit elements such as rectifiers, transistors, and other types of semiconductor elements which are not a part of the present invention. It should be noted that if a diffusion process is used to dope the silicon and produce a diffused junction 17 (FIG. 8) the edge of the junction is covered by a portion of the silicon oxide insulating film. It is this portion of the covering which eliminates the leakage currents.

An alternate method of depositing the covering on top of the silicon oxide comprises the formation of silicon oxide coating of at least 1.5 microns. Then, instead of a layer of powdered photosensitive glass, only active photosensitive materials are dusted on the silicon oxide surface. A mixture of such materials may include 32 parts of lithium carbonate ($Li_2CO_3$), 7.1 parts of aluminum hydroxide ($Al(OH)_3$), and .09 part of silver chloride (AgCl). After dusting on the surface, the crystal is heated in a furnace to melt the photosensitive material and diffuse it into the silicon oxide layer. The remainder of the process is the same as described above.

The foregoing disclosure and drawings are merely illustrative of the principles of this invention and are not to be interpreted in a limiting sense. The only limitations are to be determined from the scope of the appended claims.

I claim:

1. A masking process for preparing semiconductor elements comprising the following steps:

(a) oxidizing a slab of silicon by heating it in an atmosphere containing oxygen to form a thin layer of silicon oxide on one side of the slab;

(b) applying a layer of powdered photosensitive glass to the oxide surface;

(c) heating the silicon slab to melt the photosensitive glass and form a unitary covering on the silicon oxide;

(d) applying an opaque mask to the photosensitive surface to block off desired areas and then irradiating the exposed areas with ultraviolet radiation to activate the photosensitive material;

(e) heating the element to develop the activated areas;

(f) subjecting the developed areas to an etching solution to dissolve the developed material and the silicon oxide underneath, and thereby uncover portions of the silicon crystal surface; and (g) diffusing into the uncovered portions of the silicon surface to form a conductivity type which differs from the conductivity type of the silicon slab.

2. A masking process for preparing semiconductor elements comprising the following steps:

(a) oxidizing a slab of silicon by heating it in an atmosphere containing oxygen to form a thin layer of silicon oxide on one side of the slab;

(b) applying a layer of powdered photosensitive glass to the oxide surface;

(c) heating the silicon slab to melt the photosensitive glass to form a unitary covering on the silicon oxide;

(d) applying an opaque mask to the photosensitive surface to block off desired areas and then irradiating the exposed areas with actinic electromagnetic radiation within the wave length range of 0.4 to 0.2 micron to activate the photosensitive glass;

(e) heating the element to develop the activated areas;

(f) subjecting the developed areas to an etching solution to dissolve and remove the developed material and the silicon oxide underneath, and thereby uncover portions of the silicon crystal surface; and (g) diffusing into the uncovered portions of the silicon surface to form a conductivity type which differs from the conductivity type of the silicon slab.

References Cited by the Examiner

UNITED STATES PATENTS

| | | | |
|---|---|---|---|
| 2,515,940 | 7/1950 | Stookey | 204—157 |
| 2,802,760 | 8/1957 | Derick et al. | 148—1.5 |
| 2,935,781 | 5/1960 | Heidenreich | 29—25.3 |
| 2,937,353 | 5/1960 | Wasserman | 252—501 |
| 2,981,877 | 4/1961 | Noyce | 148—33.3 |
| 3,025,589 | 3/1962 | Hoerni | 96—36 |
| 3,036,006 | 5/1962 | Nessl | 252—62.3 |
| 3,055,776 | 9/1962 | Stevenson et al. | 148—33.3 |
| 3,066,052 | 11/1962 | Howard | 148—1.5 |
| 3,104,991 | 9/1963 | MacDonald | 148—33.3 |
| 3,122,817 | 3/1964 | Andrus | 148—1.5 |

OTHER REFERENCES

Electronics, May 1, 1959, pp. 70 and 72.

NORMAN G. TORCHIN, *Primary Examiner.*

ALEXANDER D. RICCI, *Assistant Examiner.*